(12) United States Patent
Chen et al.

(10) Patent No.: US 8,717,747 B2
(45) Date of Patent: May 6, 2014

(54) ELECTRONIC DEVICE HAVING STOWABLE DISPLAY UNIT

(75) Inventors: Chih-Hung Chen, New Taipei (TW); Tzu-Yi Huang, New Taipei (TW)

(73) Assignee: Wistron Corporation, New Taipei (TW)

( * ) Notice: Subject to any disclaimer, the term of this patent is extended or adjusted under 35 U.S.C. 154(b) by 136 days.

(21) Appl. No.: 13/154,250

(22) Filed: Jun. 6, 2011

(65) Prior Publication Data

US 2012/0050974 A1 Mar. 1, 2012

(30) Foreign Application Priority Data

Sep. 1, 2010 (TW) .............................. 99216948 U

(51) Int. Cl.
*H05K 5/00* (2006.01)
*H05K 7/00* (2006.01)
*A47B 81/00* (2006.01)
*H01R 13/62* (2006.01)

(52) U.S. Cl.
USPC ............ 361/679.01; 361/679.04; 361/679.06; 361/679.27; 361/679.28; 361/679.29; 312/223.1; 312/223.2; 439/153; 439/327

(58) Field of Classification Search
USPC ............... 361/679.31–679.4, 679.55, 679.58, 361/724–727, 679.01–679.09; 312/223.1, 312/223.2, 223.3; 248/220.31, 220.41; 439/157, 60, 152–153, 327, 328, 331
See application file for complete search history.

(56) References Cited

U.S. PATENT DOCUMENTS 5,850,215 A * 12/1998 Kamiya et al. ................. 345/204
2002/0101117 A1* 8/2002 Shibuya .......................... 307/9.1

* cited by examiner

*Primary Examiner* — Jenny L Wagner
*Assistant Examiner* — Jerry Wu
(74) *Attorney, Agent, or Firm* — Ladas & Parry, LLP

(57) ABSTRACT

An electronic device having a stowable display unit includes a housing, a slide element, a display unit, and a control module. The housing has a receiving space, and an opening at a front side of the housing. The slide element is disposed in the receiving space, and is connected slidably to the housing. The display unit is disposed in the receiving space, and is connected pivotally to a front end of the slide element. The control module includes an actuating mechanism connected to a rear end of the slide element, and a control unit provided on the housing and controlling operation of the actuating mechanism. The actuating mechanism is controllable by the control unit to activate movement of the slide element to move the display unit to a used position externally of the opening.

9 Claims, 13 Drawing Sheets

ELECTRONIC DEVICE HAVING STOWABLE DISPLAY UNIT

CROSS-REFERENCE TO RELATED APPLICATIONS

This application claims priority of Taiwanese Patent Application No. 099216948 filed on Sep. 1, 2010, the disclosures of which is incorporated herein by reference.

BACKGROUND OF THE INVENTION

1. Field of the Invention

This invention relates to an electronic device, and more particularly to an electronic device having a stowable display unit.

2. Description of the Related Art

Referring to FIGS. 1 and 2, a conventional server 1 usually includes a housing 11, two handles 12 projecting from a front end of the housing 11, and a display unit 13 connected rotatably to one of the handles 12. When the display unit 13 is in a used position, the display unit 13 is disposed in front of the housing 11, and blocks some of the hard disc holders 14 that are installed inside the housing 11. When it is desired to remove the blocked hard disc holders 14 from the housing 11, the display unit 13 is first rotated outwardly relative to the housing 11 at an angle of about 90° to an opened position before the hard disc holders 14 can be pulled out from the housing 11. Repair or replacement of the hard disc holders 14 can then be performed.

Since the display unit 13 is spaced apart from the front end of the housing 11 in the opened position, the display unit 13 is easily hit by an external force that may result in its damage. Worst is, it may be fractured from the handle 12. Therefore, the area of improvement that the present invention focuses on is that related to realizing a structural design of an electronic device having a stowable display unit.

SUMMARY OF THE INVENTION

A main object of the present invention is to provide an electronic device having a stowable display unit. Through activation of a control module, the display unit can be moved automatically between a stored position and a used position to facilitate use of the display unit and prevent the display unit from being hit by an external force that may result in its damage.

The purpose of the present invention and the solution to the conventional technical problems are achieved through employment of the below technical means. According to the disclosure of the present invention, an electronic device having a stowable display unit comprises a housing, a slide element, a display unit, and a control module. The housing has a receiving space, and an opening at a front side of the housing. The slide element is disposed in the receiving space, and is connected slidably to the housing. The display unit is disposed in the receiving space, and is connected pivotally to a front end of the slide element. The control module includes an actuating mechanism connected to a rear end of the slide element, and a control unit provided on the housing and controlling operation of the actuating mechanism. The actuating mechanism is controllable by the control unit to activate movement of the slide element to move the display unit to a used position externally of the opening.

Through the aforesaid technical means, the advantages and effectiveness of the electronic device having the stowable display unit according to the present invention reside in the fact that through the control module, the actuating mechanism can be activated to automatically move the display unit between the used position and the stored position, thereby enhancing the use of the present invention and preventing the display unit from being hit by an external force that may result in its damage.

BRIEF DESCRIPTION OF THE DRAWINGS

Other features and advantages of the present invention will become apparent in the following detailed description of the embodiments of the invention, with reference to the accompanying drawings, in which.

DETAILED DESCRIPTION OF THE PREFERRED EMBODIMENTS

Figure 1:
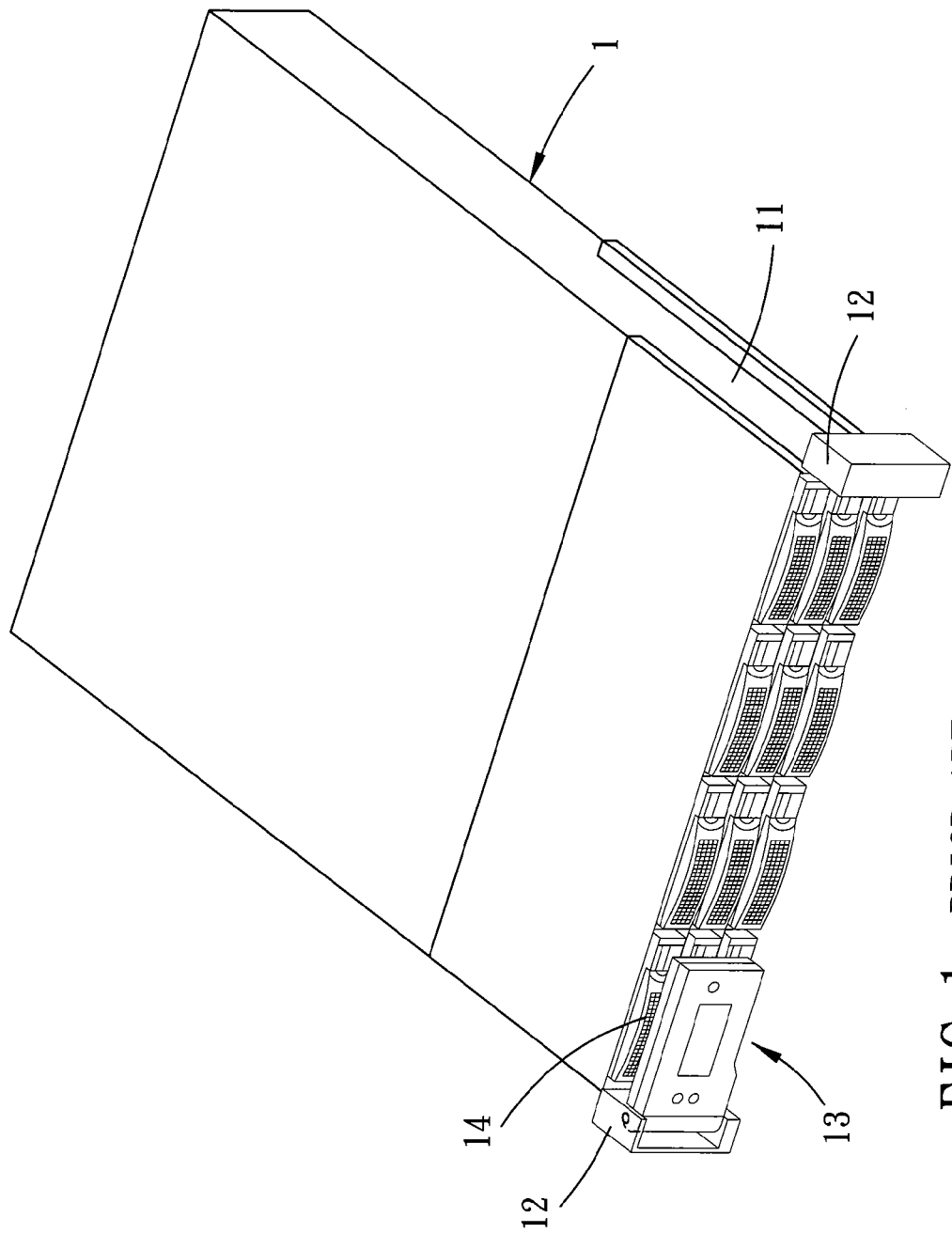
FIG. 1 is a perspective view of a conventional server, illustrating a display unit in a used position.
Figure 2:
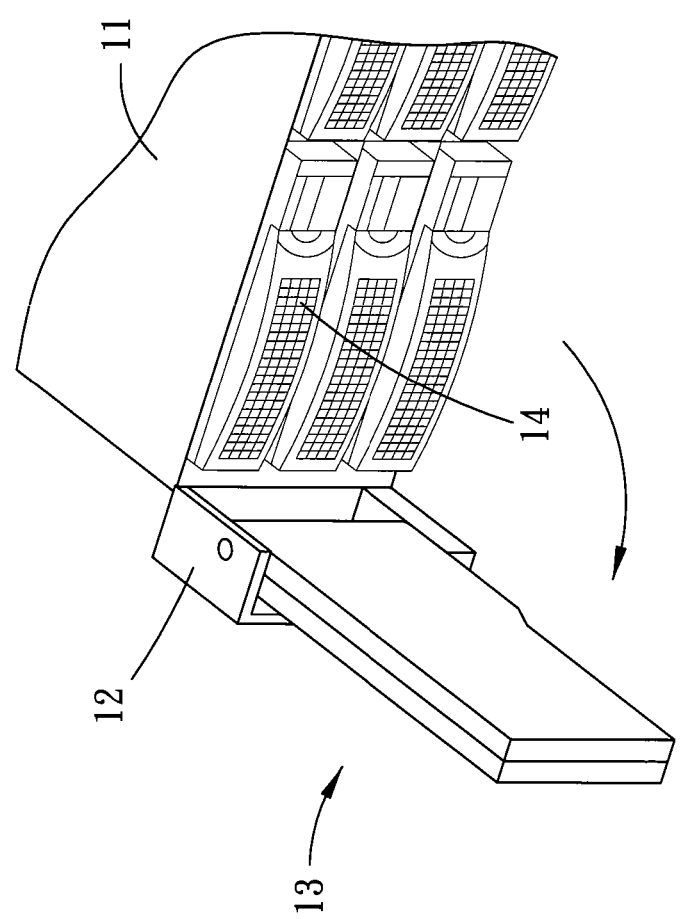
FIG. 2 is a fragmentary perspective view of the conventional server, illustrating the display unit in an opened position.

The above-mentioned and other technical contents, features, and effects of this invention will be clearly presented from the following detailed description of the three embodiments in coordination with the reference drawings. Through description of the concrete implementation method, the technical means employed and the effectiveness to achieve the predetermined purposes of the present invention will be thoroughly and concretely understood. However, the enclosed drawings are used for reference and description only, and are not used for limiting the present invention.

Before this invention is described in detail, it should be noted that, in the following description, similar elements are designated by the same reference numerals.

Referring to FIGS. 3 to 9, an electronic device 200 having a stowable display unit according to the first embodiment of the present invention is exemplified as a server. The electronic device 200 comprises a housing 2 and a plurality of hard disc holders 20. The housing 2 includes a plurality of insert grooves 211 each opening at a front side of the housing 2. Each hard disc holder 20 is inserted removably in a respective insert groove 211.

The housing 2 further includes a top plate 212, and a top cover 22 connected detachably to the housing 2 to cover the top plate 212. The top cover 22 and the top plate 212 cooperatively define a receiving space 23, and an opening 24 to communicate the receiving space 23 with an external portion of the housing 2.

The electronic device 200 further comprises a slide element 3 and a display unit 4 both disposed in the receiving space 23. The top plate 212 is provided with left and right slide rails 213 disposed in the receiving space 23. Each slide rail 213 has an elongated slide groove 214 extending in a front-rear direction. The slide element 3 is configured as a slide plate, and includes two slide portions 31, in the form of slide pins, projecting respectively from left and right sides of the slide element 3 in proximity to a rear end thereof and slidable respectively on the slide rails 213. Each slide portion 31 is connected slidably to a respective slide groove 214. Through this configuration, the slide element 3 can slide forward and rearward along the slide grooves 214 relative to the housing 2.

The display unit 4 includes a casing 41, a display panel 42 disposed on the casing 41, and a plurality of control keys 43 provided on the casing 41 and adapted to be pressed by a user. The display panel 42 may be a liquid crystal display panel or a plasma display panel. The display unit 4 can be connected electrically to a motherboard 6 (see FIG. 6) that is disposed inside the housing 2 by using a conducting wire (not shown), so that the user can control and setup the electronic device 200 through the display unit 4.

The slide element 3 further includes two ears 32 projecting from a front end thereof and spaced apart in a left-right direction. The outer casing 41 of the display unit 4 is connected pivotally between the ears 32 using two pivot pins 33. Through this configuration, the display unit 4 can pivot relative to the slide element 3 about the pivot pins 33.

Figure 4:
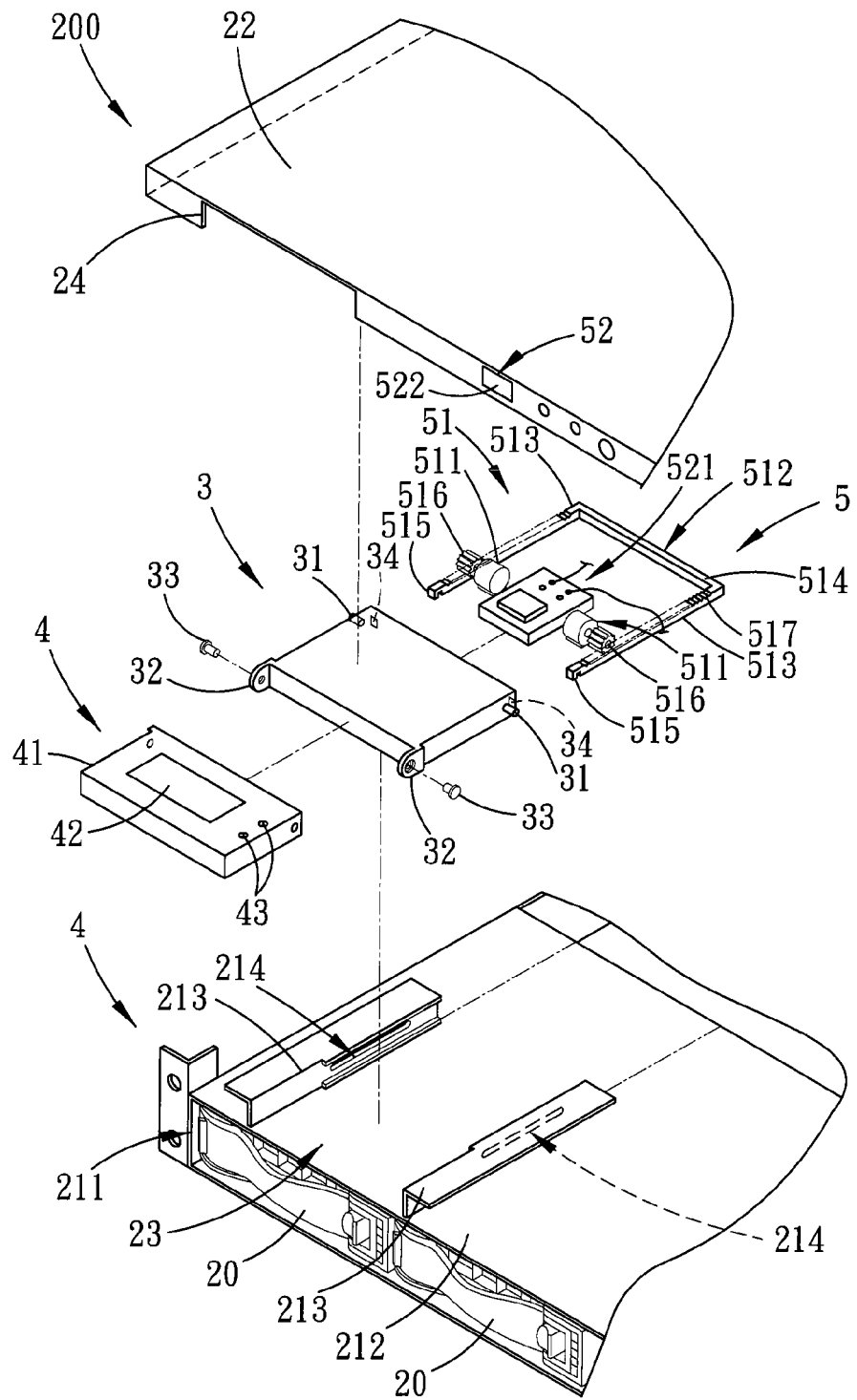
FIG. 4 is a fragmentary exploded perspective view of the first embodiment.
Figure 5:
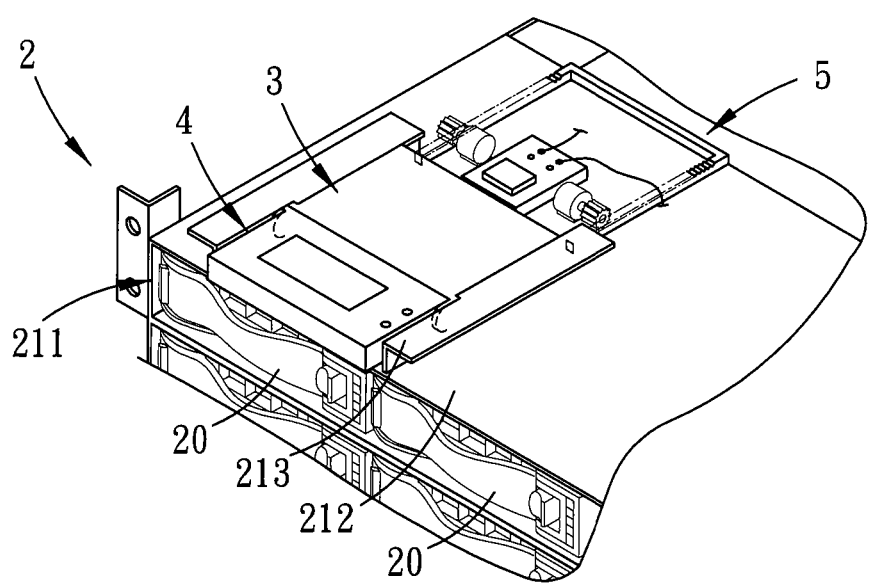
FIG. 5 is a fragmentary perspective view of the first embodiment in an assembled state, but with a top cover removed to show the display unit in the stored position.
Figure 6:
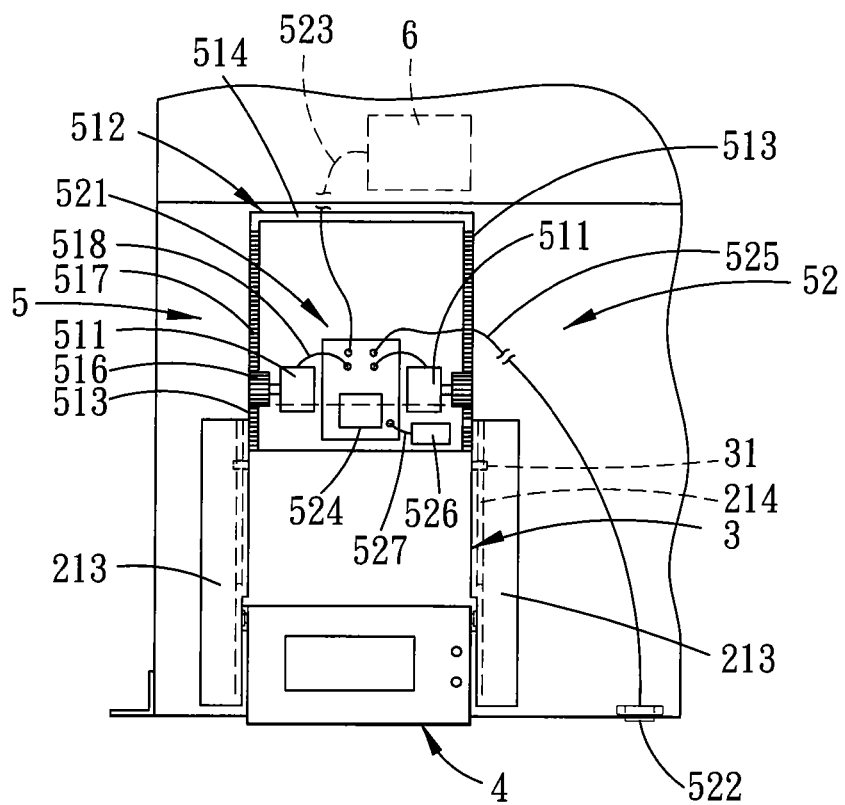
FIG. 6 is a fragmentary schematic top view of the first embodiment.

With reference to FIGS. 4, 5, and 6, in order for the display unit 4 to move automatically between a stored position (see FIG. 5), where the display unit 4 is disposed in the receiving space 23, and a used position (see FIG. 8), where the display unit 4 extends through the opening 24 to be disposed on the front side of the housing 2, the electronic device 200 further comprises a control module 5. The control module 5 includes an actuating mechanism 51 connected to a rear end of the slide element 3, and a control unit 52 provided on the housing 2 and controlling operation of the actuating mechanism 51.

The actuating mechanism 51 includes two drive motors 511 provided on the top plate 212 and spaced apart in a left-right direction, and a U-shaped actuating rod 512. The actuating rod 512 includes two drive rod portions 513 spaced apart in a left-right direction, and a cross rod portion 514 interconnecting rear ends of the drive rod portions 513. A front end of each drive rod portion 513 may be connected to the rear end of the slide element 3 through any suitable connecting method, such as a hook-engaging method, a screwing method, a welding method, or an adhering method. In this embodiment, the front end of each drive rod portion 513 has an engaging hook 515 engaged to one of engaging grooves 34 in the rear end of the slide element 3. Hence, the actuating rod 512 can be stably and fixedly connected to the slide element 3.

Further, each drive motor 511 includes a gear wheel 516. Each drive rod portion 513 includes a plurality of rack teeth 517 to mesh with the gear wheel 516. When the gear wheel 516 of each drive motor 511 rotates, the gear wheel 516 can drive the actuating rod 512 to move forwardly or rearwardly, so that the actuating rod 512 can activate the slide element 3 to move forward or rearward along the slide groove 214. It is worth mentioning that, although two drive motors 511 are exemplified in this embodiment, in an alternative embodiment, only one drive motor 511 may be provided. The effect of moving the slide element 3 can be similarly achieved.

The control unit 52 includes a control circuit 521 disposed on the top plate 212, and a control element 522 provided on the front end of the top cover 22. The control circuit 521 is disposed between the drive motors 511, and is connected electrically to the motherboard 6 through a conducting wire 523. Each drive motor 511 is connected electrically to the control circuit 521 through a conducting wire 518. Through this configuration, a central processor 524 of the control circuit 521 can control the motherboard to transmit power source to each drive motor 511 to rotate the same and to control a normal or reverse turn of the gear wheel 516.

In this embodiment, the control element 522 includes a fingerprint sensor connected electrically to the control circuit 521 through a conducting wire 525. When the control element 522 senses the user's fingerprint, fingerprint data sensed thereof is transmitted to the control circuit 521 through the conducting wire 525. The control unit 52 further includes a data-storing unit 526 containing pre-stored fingerprint data. The data-storing unit 526 is connected electrically to the control circuit 521 through a conducting wire 527. The central processor 524 compares fingerprint data sensed by the control element 522 with the pre-stored fingerprint data of the data-storing unit 526. The control circuit 521 controls rotation of each drive motor 511 based on a result of comparison between the fingerprint data sensed by the fingerprint sensor and the pre-stored fingerprint data of the data-storing unit 526.

Figure 3:
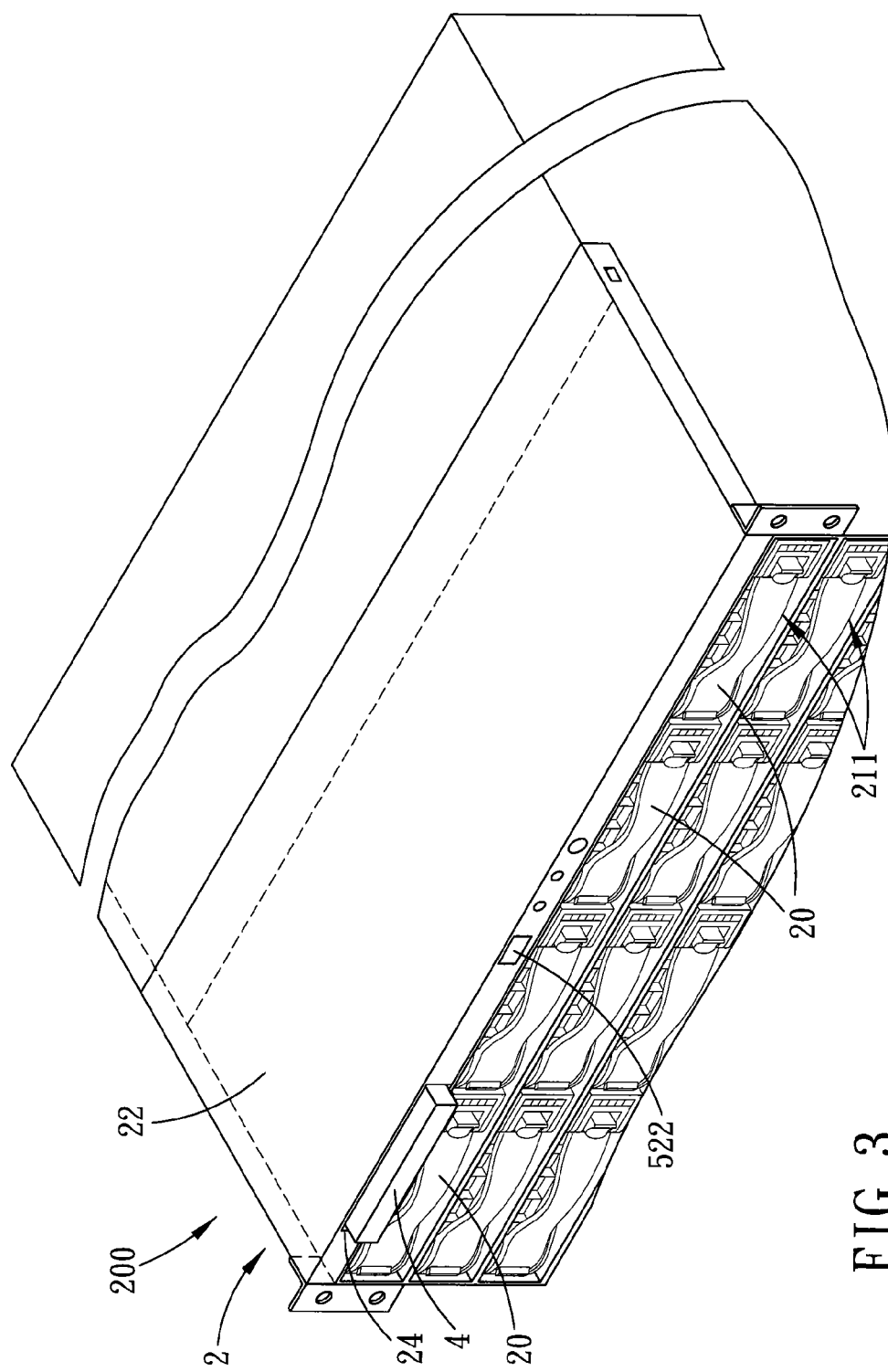
FIG. 3 is a fragmentary perspective view of an electronic device having a stowable display unit according to the first embodiment of the present invention, illustrating the display unit in a stored position.

With reference to FIGS. 3, 5, and 6, when the display unit 4 is in the stored position, the display unit 4 and the slide element 3 are aligned horizontally in the receiving space 23, and the display unit 4 closes the opening 24 and unblocks the hard disc holders 20. Through this configuration, the display unit 4 can be prevented from being hit by an external force that may result in its damage or breakage.

Figure 7:
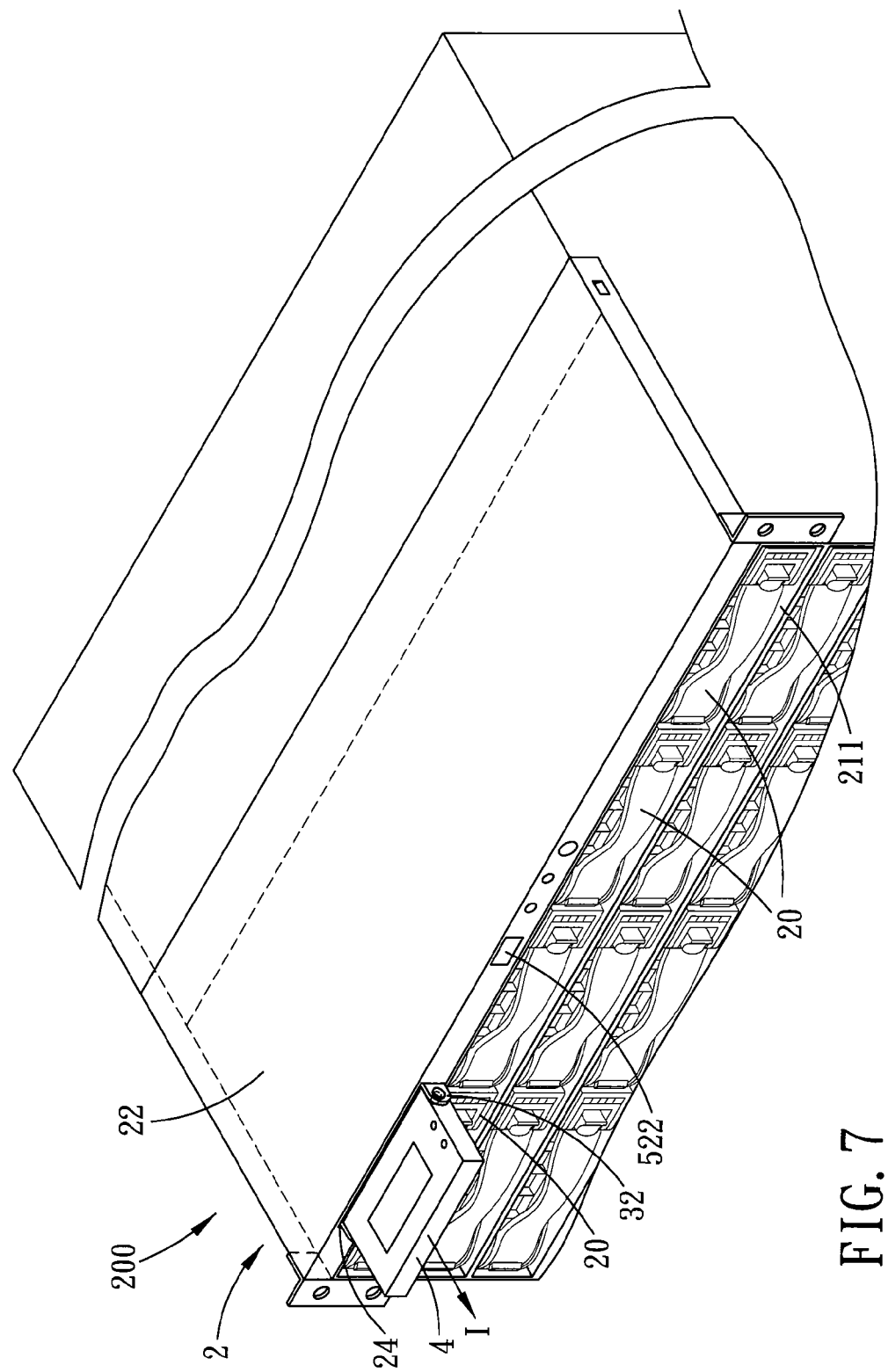
FIG. 7 is a view similar to FIG. 3, but with the display unit extending out of a housing.
Figure 8:
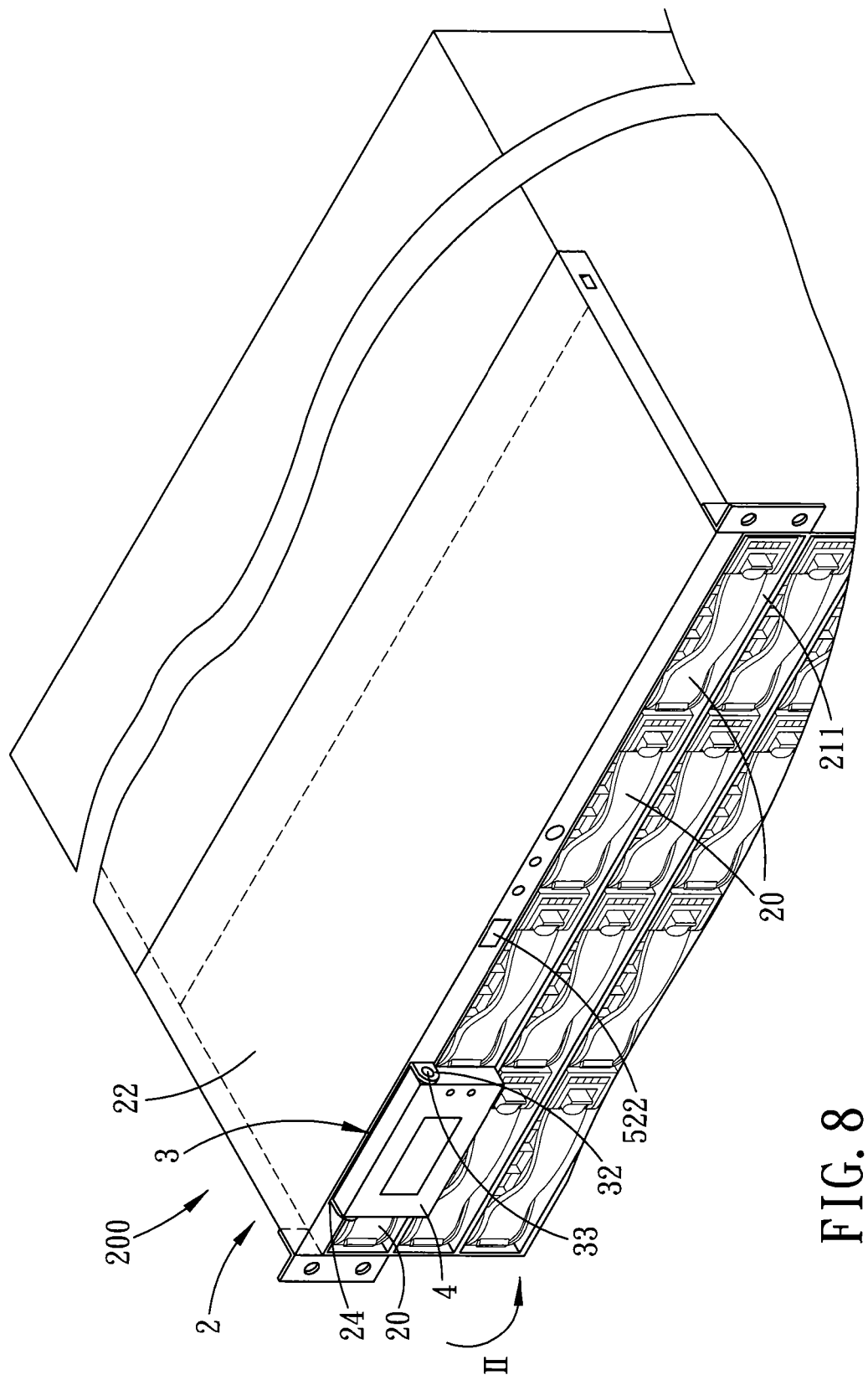
FIG. 8 is a view similar to FIG. 7, but with the display unit in a used position.
Figure 9:
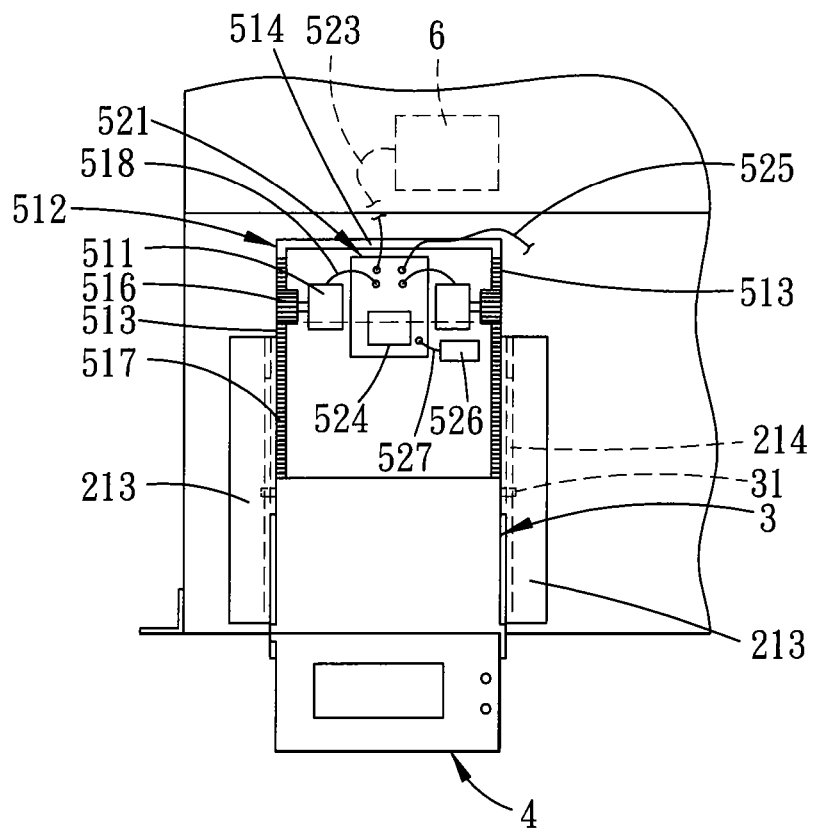
FIG. 9 is a fragmentary schematic top view of the first embodiment, illustrating the display unit extending out of the housing.

With reference to FIGS. 7, 8, and 9, if the user desires to use the display unit 4, the user's finger is first aimed at the control element 522 so that the control element 522 can produce fingerprint data that is transmitted to the central processor 524. The central processor 524 then compares the fingerprint data sensed by the control element 522 with the pre-stored fingerprint data of the data-storing unit 526. If the result of the comparison between the fingerprint data sensed by the control element 522 and the pre-stored fingerprint data in the data-storing unit 526 is incorrect, the central processor 524 will not activate rotation of each drive motor 511. But, if the result of the comparison is correct, the central processor 524 will activate rotation of each drive motor 511. When the gear wheel 516 of each drive motor 511 makes a normal turn, it will drive the actuating rod 512 to move along the direction of an arrow (I) to push the slide element 3 and the display unit 4 forwardly, so that the display unit 4 gradually moves out of the opening 24. As the slide portions 31 abut respectively against front ends of the respective slide grooves 214, the display unit 4 is moved completely out of the receiving space 23, and through its own weight, pivots downwardly relative to the slide element 3 about the pivot pins 33 along the direction of an arrow (II), so that the display unit 4 is disposed vertically, and blocks partially the front end of the housing 2. At this time, the display unit 4 is in the used position, and the user can manipulate the electronic device 200 by operating the control keys 43.

When the user desires to store the display unit 4, the user's finger is again aimed at the control element 522 so that the central processor 524 can compare the fingerprint data sensed by the control element 522 with the pre-stored fingerprint data of the data-storing unit 526. If the result of the comparison is correct, the central processor 524 will activate rotation of each drive motor 511. The gear wheel 516 of each drive motor 511 will make a reverse turn, so that the actuating rod 512 can move along a reverse direction of the arrow (I) to pull the slide element 3 and the display unit 4 rearwardly. When the display unit 4 abuts against a front end of the top plate 212, the display unit 4 is gradually pushed upward by the top plate 212. As the slide portions 31 abut respectively against rear ends of the slide grooves 214, the slide element 3 cannot move further rearwardly. At this time, the display unit 4 is disposed in the stored position.

Through the configuration of the control module 5, the user only has to have his/her finger sensed by the control element 522 to move automatically the display unit 4 from the stored position to the used position or vice versa, thereby enhancing use of the present invention and preventing the display unit 4 from being hit by an external force. Further, through the central processor 524 of the control circuit 521, the fingerprint data sensed by the control element 522 can be compared with the pre-stored fingerprint data of the data-storing unit 526. The result of the comparison can decide whether or not to activate rotation of each drive motor 511. Hence, a safe mechanism is provided to prevent unauthorized personnel from controlling the electronic device 200 at his/her leisure.

Figure 10:
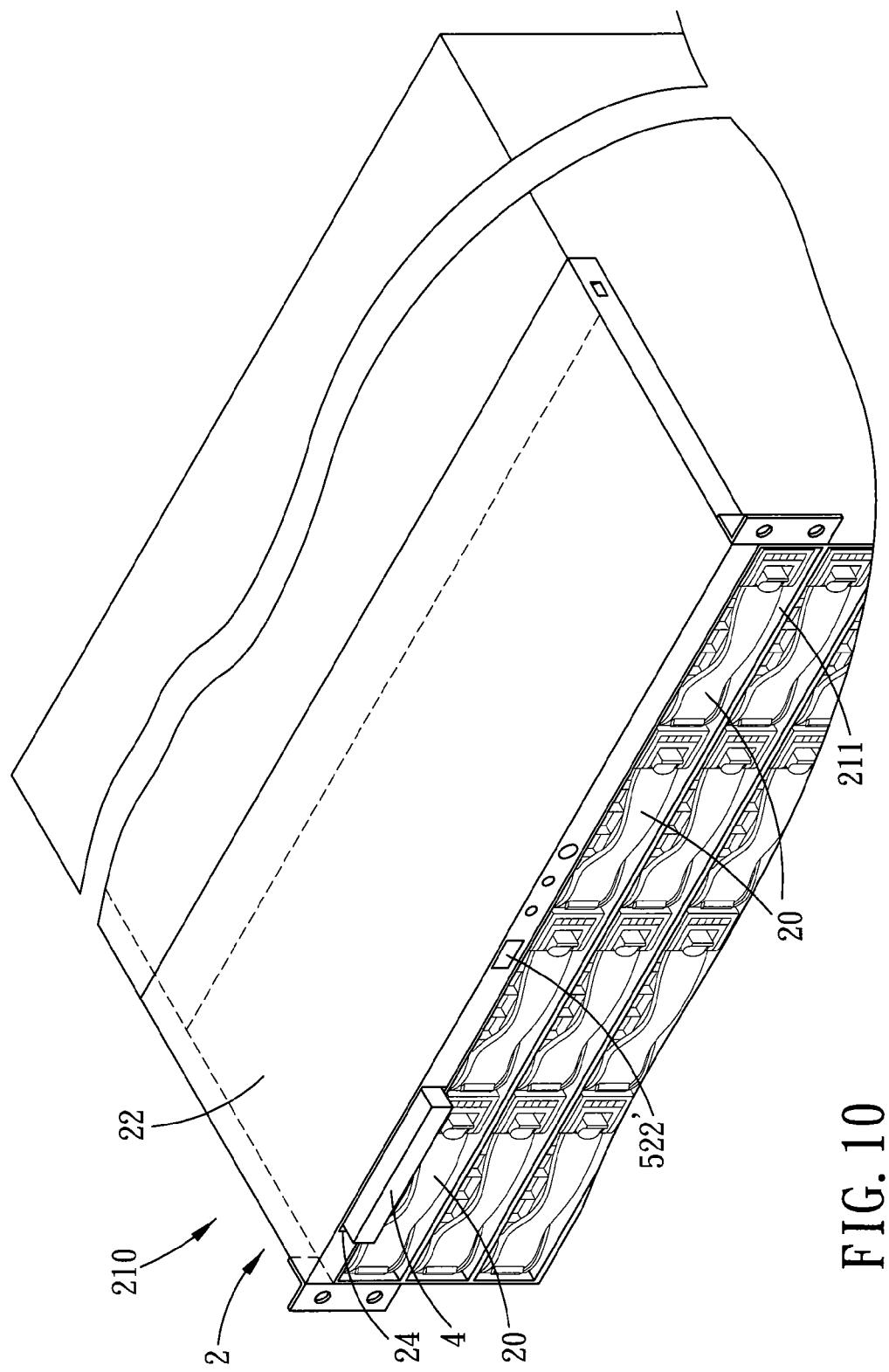
FIG. 10 is a fragmentary perspective view of an electronic device having a stowable display unit according to the second embodiment of the present invention.
Figure 11:
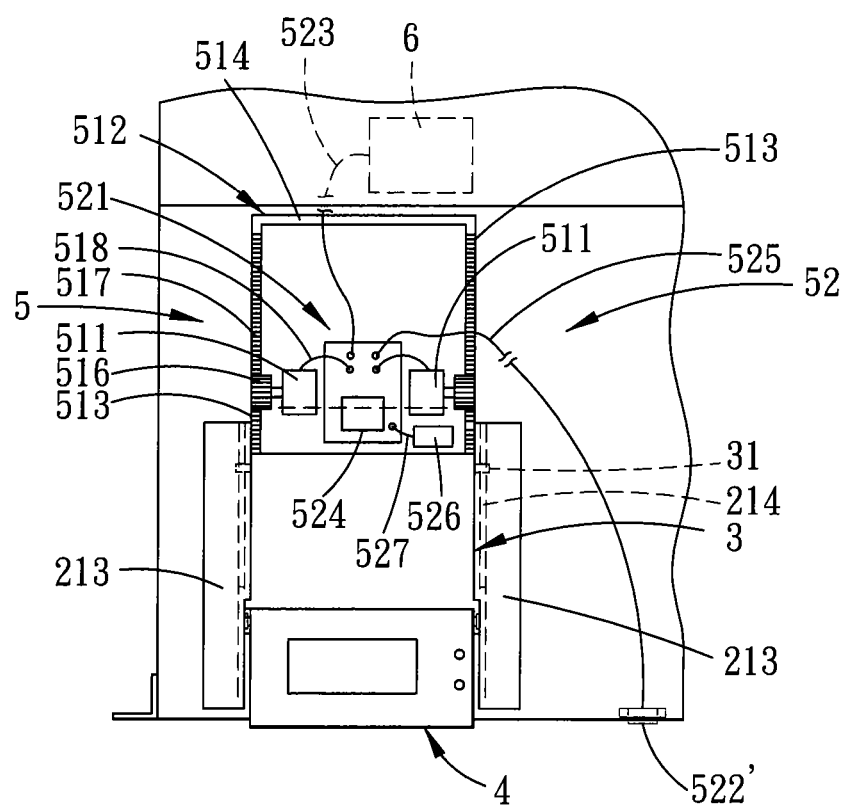
FIG. 11 is a fragmentary schematic top view of the second embodiment, illustrating the display unit in a stored position.

Referring to FIGS. 10 and 11, an electronic device 210 according to the second embodiment of the present invention has a structure and an operating method similar to that described in the first embodiment. The difference between the first and second embodiments resides in the configuration of the control element 522'. In this embodiment, the control element 522' includes a voice sensor to sense the user's voice.

When the user speaks a specific word, for example, "expose the display unit" or "store the display unit," to the control element 522', the central processor 524 will compare the voice data sensed by the control element 522' with pre-stored voice data of the data-storing unit 526. If the comparison result is incorrect, the central processor 524 will not activate rotation of each drive motor 511. If the comparison result is correct, the central processor 524 will activate rotation of each drive motor 511. Through this configuration, the display unit 4 can be actuated to move automatically to the used position or the stored position.

Figure 12:
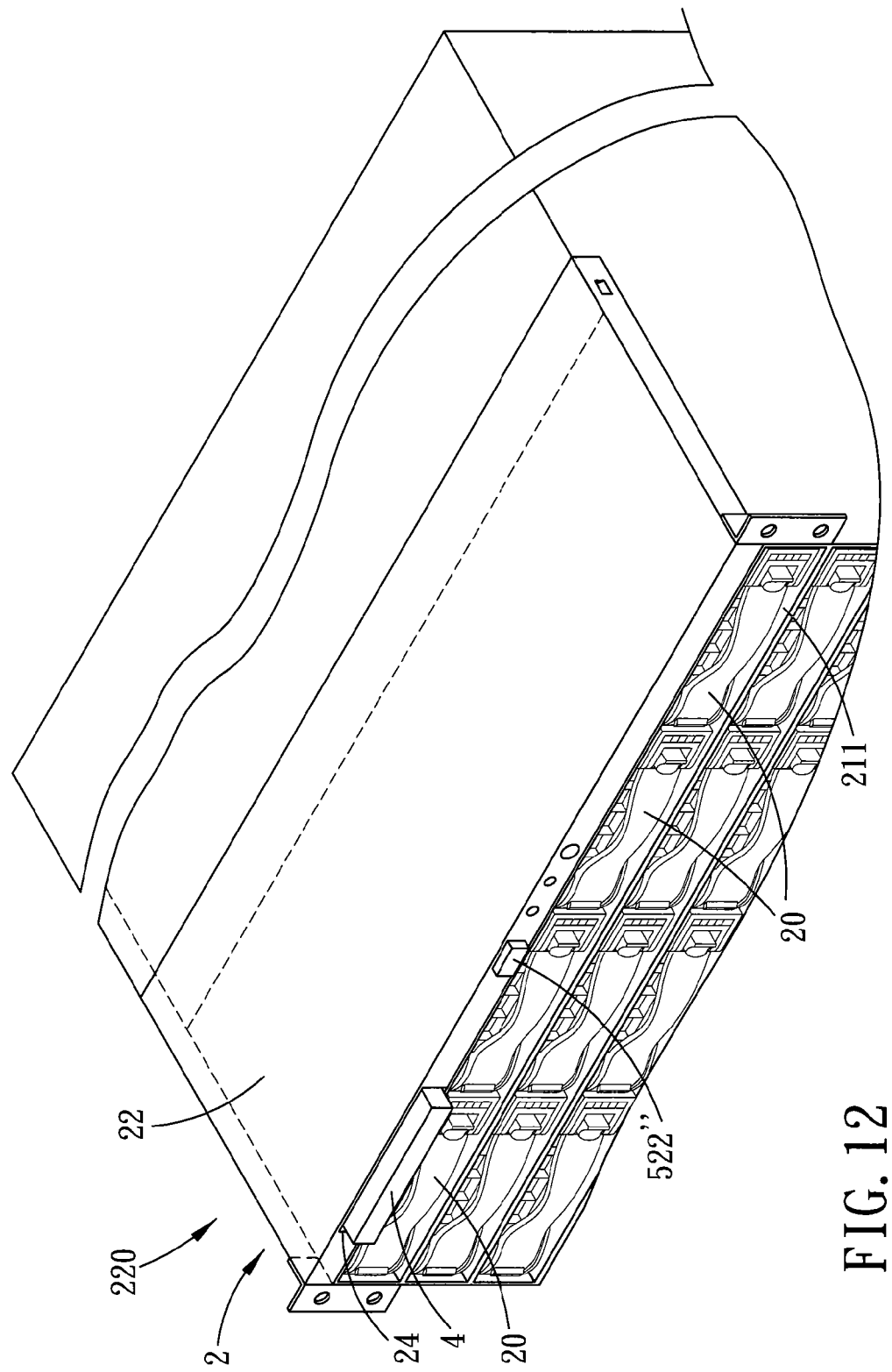
FIG. 12 is a fragmentary perspective view of an electronic device having a stowable display unit according to the third embodiment of the present invention.
Figure 13:
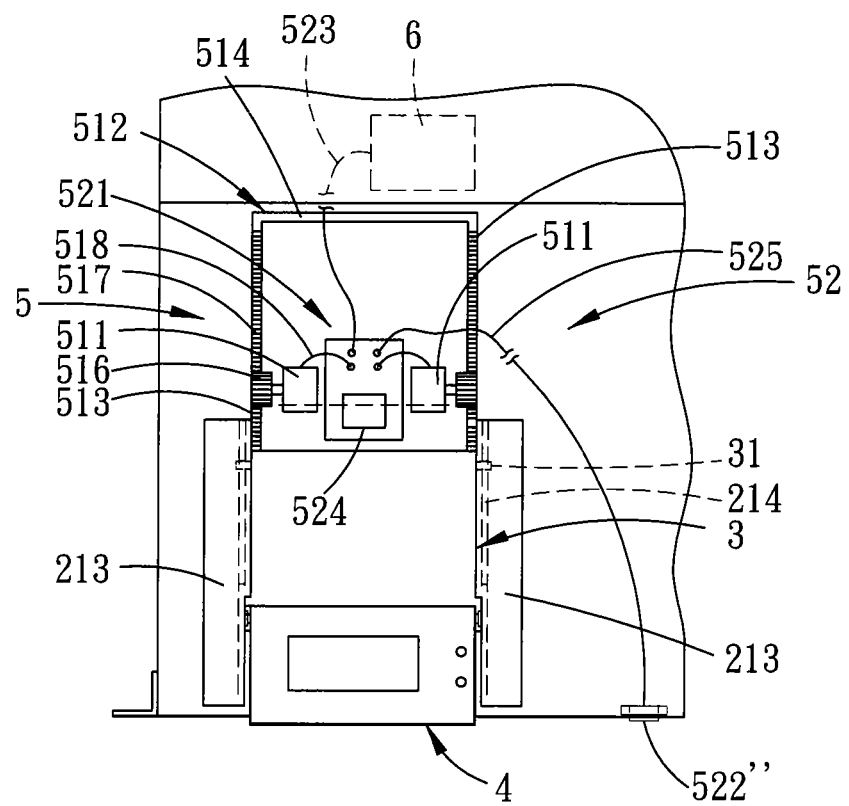
FIG. 13 is a fragmentary schematic top view of the third embodiment, illustrating the display unit in a stored position.

Referring to FIGS. 12 and 13, an electronic device 220 according to the third embodiment of the present invention has a structure and an operating method similar to that described in the first embodiment. The difference between the first and third embodiments resides in the configuration of the control element 522". In this embodiment, the control element 522" is configured as a push button.

By pressing the control element 522", the control element 522" will produce a control signal that is transmitted to the central processor 524 through the conducting wire 525. The central processor 524 then activates rotation of each drive motor 511, and the display unit 4 is actuated to move automatically to the exposed or stored position.

From the aforesaid description, through the control element 522, 522', 522" of the control module 5, the actuating mechanism 51 can be actuated to automatically move the display unit 4 to the exposed or stored position, thereby enhancing use of the present invention and preventing the display unit 4 from being hit by an external force that may result in its damage. Hence, the object of the present invention can be realized.

While the present invention has been described in connection with what are considered the most practical and embodiments, it is understood that this invention is not limited to the disclosed embodiments but is intended to cover various arrangements included within the spirit and scope of the broadest interpretations and equivalent arrangements.

We claim:

1. An electronic device having a stowable display unit, comprising:
    a housing having a receiving space, an opening at a front side of said housing, and left and right slide rails disposed in said receiving space;
    a slide element disposed in said receiving space and including two slide portions slidable respectively on said slide rails to move forward and rearward;
    a display unit disposed in said receiving space and connected pivotally to a front end of said slide element, said display unit being pivotable but non-slidable relative to said slide element; and
    a control module including an actuating mechanism connected to a rear end of said slide element, and a control unit provided on said housing and controlling operation of said actuating mechanism, said actuating mechanism including a drive motor connected electrically to said control unit, and an actuating rod activated by said drive motor and connected to said slide element, said drive motor being controllable by said control unit to activate movement of said actuating rod to push forward linearly said slide element so as to move said display unit to a used position externally of said opening and to pull rearward said slide element so as to move said display unit from said used position to a stored position.

2. The electronic device of claim 1, wherein said drive motor includes a gear wheel, and said actuating rod includes a plurality of rack teeth to mesh with said gear wheel.

3. The electronic device of claim 1, wherein said slide element includes an engaging groove, and said actuating rod includes an engaging hook engaged to said engaging groove.

4. The electronic device of claim 1, wherein said control unit includes a control circuit connected electrically to said drive motor, and a control element connected electrically to said control circuit, said control element controlling said control circuit to activate rotation of said drive motor.

5. The electronic device of claim 4, wherein said control element includes a fingerprint sensor, said control unit further including a data-storing unit connected electrically to said control circuit, said control circuit controlling rotation of said drive motor based on a result of comparison between data sensed by said fingerprint sensor and pre-stored fingerprint data of said data-storing unit.

6. The electronic device of claim 4, wherein said control element includes a voice sensor, said control unit further including a data-storing unit connected electrically to said control circuit, said control circuit controlling rotation of said drive motor based on a result of comparison between data sensed by said voice sensor and pre-stored voice data of said data-storing unit.

7. The electronic device of claim 4, wherein said control element includes a fingerprint sensor, said control unit further including a data-storing unit connected electrically to said control circuit, said control circuit controlling rotation of said drive motor based on a result of comparison between data sensed by said fingerprint sensor and pre-stored fingerprint data of said data-storing unit.

8. The electronic device of claim 4, wherein said control element includes a voice sensor, said control unit further including a data-storing unit connected electrically to said control circuit, said control circuit controlling rotation of said drive motor based on a result of comparison between data sensed by said voice sensor and pre-stored voice data of said data-storing unit.

9. An electronic device having a stowable display unit, comprising:
  a housing having a receiving space, an opening at a front side of said housing, and left and right slide rails disposed in said receiving space;
  a slide element disposed in said receiving space and including two slide portions slidable respectively on said slide rails to move forward and rearward;
  a display unit disposed in said receiving space and connected pivotally to a front end of said slide element, said display unit being pivotable but non-slidable relative to said slide element; and
  a control module including an actuating mechanism connected to a rear end of said slide element, and a control unit provided on said housing and controlling operation of said actuating mechanism, said actuating mechanism including two drive motors connected electrically to said control unit and respectively having a motor shaft, a pair of gear wheels connected directly and respectively to said motor shafts of said drive motors and respectively driven by said drive motors, and an actuating rod that includes a pair of drive rod portions connected to said rear end of said slide element, each of said drive rod portions including a plurality of rack teeth meshing with a respective one of said gear wheels, said drive rod portions of said actuating rod being movable linearly forward and rearward, said drive motors being controllable by said control unit to activate simultaneously movement of said drive rod portions of said actuating rod to push forward said slide element so as to move said display unit to a used position externally of said opening and to pull rearward said slide element so as to move said display unit from said used position to a stored position.

* * * * *